United States Patent

[11] 3,571,923

[72] Inventors Joseph M. Shaheen
La Habra;
Sterling Graydon, Jr., Santa Ana, Calif.
[21] Appl. No. 787,720
[22] Filed Dec. 30, 1968
[45] Patented Mar. 23, 1971
[73] Assignee North American Rockwell Corporation

[54] METHOD OF MAKING REDUNDANT CIRCUIT BOARD INTERCONNECTIONS
3 Claims, 8 Drawing Figs.

[52] U.S. Cl. ........ 29/625, 29/628, 29/530, 117/212, 174/68.5, 204/38, 339/17
[51] Int. Cl. ........ B41m 3/08
[50] Field of Search ........ 29/625—630, 530; 339/17; 174/68.5; 204/38; 117/212

[56] References Cited

UNITED STATES PATENTS 2,889,393 6/1959 Berger ........ 339/17
2,907,925 10/1959 Parsons ........ 174/68.5
3,491,197 1/1970 Walkow ........ 174/68.5

*Primary Examiner*—John F. Campbell
*Assistant Examiner*—Robert W. Church
*Attorneys*—L. Lee Humphries and Robert G. Rogers

ABSTRACT: Solid interconnections are deposited sequentially on circuit pads of each layer of a multilayer combination. The interconnection is made such that an alternating series of solid metal posts and metal pads are achieved as a through connection of the multilayer board. Subsequently, the solid interconnections and the circuit terminals of each layer are drilled. The inner surfaces of the solid interconnections, and the inner surfaces of the circuit terminals, exposed by the drilling, are then plated.

As a result, one electrical contact between layers is provided through the undrilled portions of the solid interconnections contacting the circuit terminals of each layer. A second, or redundant, electrical contact is provided through the plated layer which contacts the surfaces exposed by the drilling.

INVENTORS
JOSEPH M. SHAHEEN
STERLING GRAYDON JR.
BY Robert G Rogers
ATTORNEY

INVENTORS
JOSEPH M. SHAHEEN
STERLING GRAYDON JR.
BY Robert G. Rogers
ATTORNEY

INVENTORS
JOSEPH M. SHAHEEN
STERLING GRAYDON JR.
BY Robert G Rogers
ATTORNEY

METHOD OF MAKING REDUNDANT CIRCUIT BOARD INTERCONNECTIONS

CROSS REFERENCE TO RELATED APPLICATION

Process for Forming Interconnections in a Multilayer Circuit Boatd—Ser. No. 577,438 filed Sept. 6, 1966, by J. M. Shaheen et al. now U.S. Pat. No. 3,464,855.

BACKGROUND OF THE INVENTION 1. 1. Field of the Invention

The invention relates to redundant multilayer interconnections and, more particularly, to such interconnections provided by plating a conducting layer over existing electrical interconnections.

2. Description of the Prior Art

At the present time, one process is used for producing one electrical interconnection between the layers of a multilayer board. The interconnections may be produced by plated through holes, mechanically inserted connectors, solid columns or posts, etc.

In all the processes no provision is made for producing redundant, or extra, interconnections. For example, in any of the existing processes, it is possible for a connection between layers to be defective. In that case, the circuits involved would not be properly interconnected. The board would probably be discarded.

It would be preferred if a process could be provided for making redundant interconnections for improving the reliability of interconnections, where such reliability is required.

SUMMARY OF THE INVENTION

Briefly, the invention comprises a process for initially interconnecting circuits of a multilayer board by depositing solid interconnections between layers of each of the boards forming the multilayer board. Terminal areas of circuits on the board support the solid interconnections.

Subsequently, the solid interconnection and terminal area are drilled to form a through hole between all layers of the multilayer board. The hole is then plated so that an additional or redundant, interconnection is made between the circuit layers.

The board is then processed according to known techniques to etch the circuits on the outside of the board.

Therefore, it is an object of this invention to provide an improved process for making reliable interconnections between layers of a multilayer board.

Another object of this invention is to provide redundant interconnections between circuit layers of a multilayer board.

Still another object of this invention is to reduce the number of discarded boards by improving the reliability of circuit interconnections.

These and other objects of this invention will become more apparent in connection with the following drawings.

DESCRIPTION OF THE PREFERRED EMBODIMENTS

Figure 1:
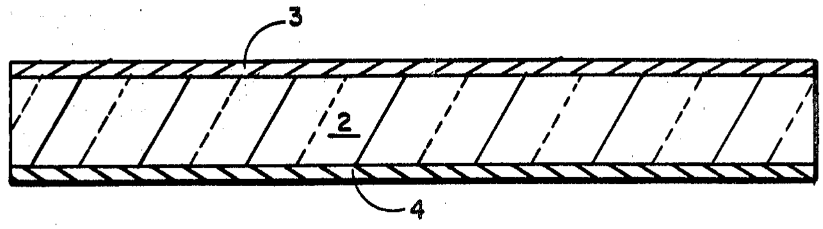
FIG. 1 is a cross-sectional view of a circuit board having copper layers on both sides of a dielectric layer.

FIG. 1 shows a cross-sectional view of circuit board 1 comprising dielectric substrate 2 covered on both sides by copper layers 3 and 4. The copper layers 3 and 4 are bonded to the dielectric substrate 2 by an adhesive (not shown).

Figure 2:
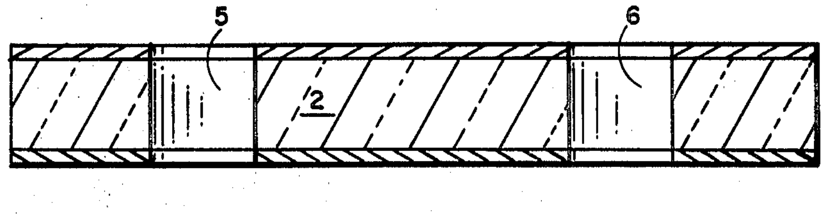
FIG. 2 is a cross-sectional view of the circuit board including a pattern of drilled holes.

FIG. 2 shows the circuit board 1 after holes 5 and 6 have been formed through the copper layers 3 and 4 and through the dielectric substrate 2 by chemical or mechanical drilling techniques well known to persons skilled in the art. Holes other than the holes shown may be formed to complete the desired hole pattern.

Figure 3:
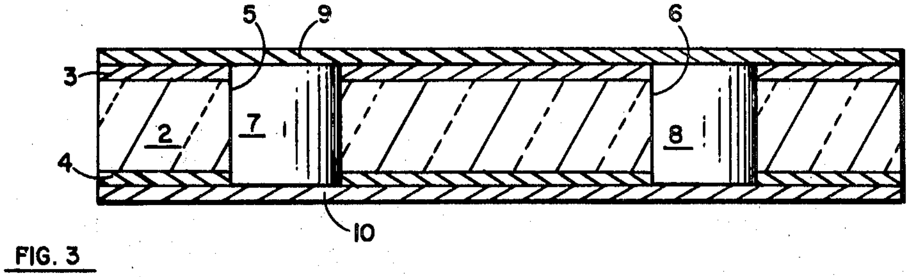
FIG. 3 is a cross-sectional view of the circuit board after the solid interconnections have been made between the copper layers.

FIG. 3 shows the circuit board 1 after solid interconnections 7 and 8 have been deposited in the opening provided by holes 5 and 6. The solid interconnections are comprised of a conducting material such as copper, copper alloy, etc. Copper layers 9 and 10 are deposited over the surface of the board to cover the tops of the interconnections 7 and 8 as well as the copper layers 3 and 4. The solid interconnections 7 and 8 as well as other solid interconnections, not shown, provide electrical conducting paths from the copper layers on one side of the board to the copper layers on the other side of the board.

Figure 4:
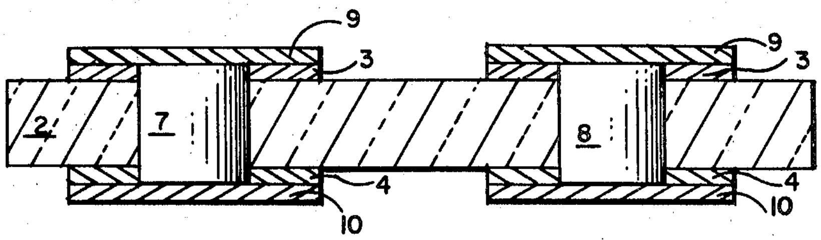
FIG. 4 is a cross-sectional view of the circuit board after the copper layers have been etched.

FIG. 4 shows circuit board 1 after layers 3, 4, 9 and 10 have been etched to form circuit patterns on the surfaces of the dielectric substrate 2. The patterns are interconnected by solid interconnectors 7 and 8. It should be understood that the complete circuit pattern as well as all the solid interconnections between the circuit patterns are not visible in FIG. 4. Circuit patterns and interconnections between the layers are determined by the particular requirements of a circuit board as is well known to persons skilled in the art.

Figure 5:
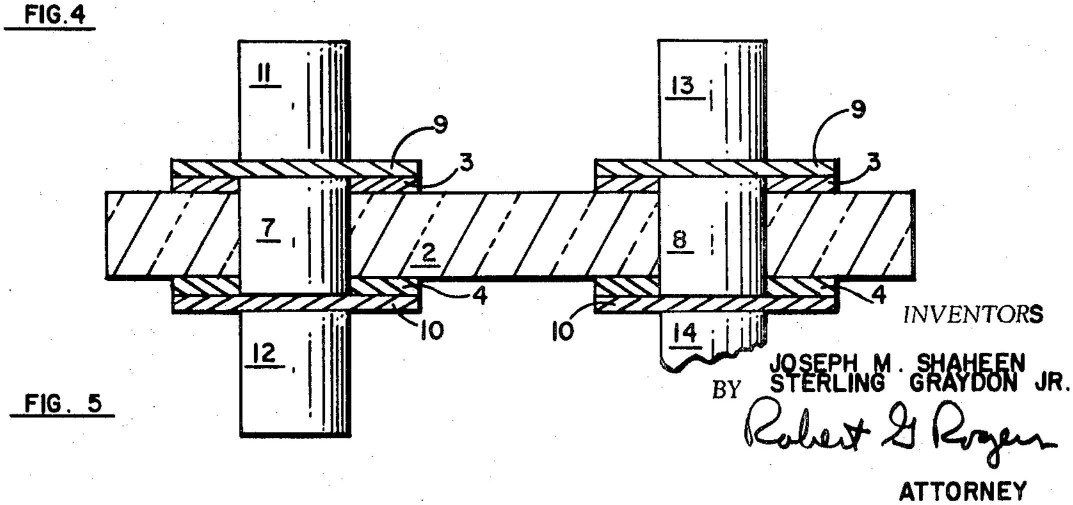
FIG. 5 is a cross-sectional view of the circuit board showing additional solid interconnections.

FIG. 5 shows the circuit board 1 after additional solid interconnections 11, 12, 13 and 14 have been deposited on top of unetched portions of copper layers 3, 4, 9 and 10 forming terminal areas of circuit patterns. Although solid interconnections may be produced in holes and on top of a circuit board by a number of processes, a preferred process is described and claimed in the referenced application. As indicated therein, a removable mask is used to first form solid protruding members or posts from a surface of the board. Subsequently, a dielectric layer with matching holes is placed over the post and a process is repeated until a multilayer board of a suitable thickness is formed. Initially, the connecting material may be deposited in the holes 5 and 6 of the first layer (substrate 2) as shown in FIG. 3 or it may be forced in by a roller.

Figure 6:
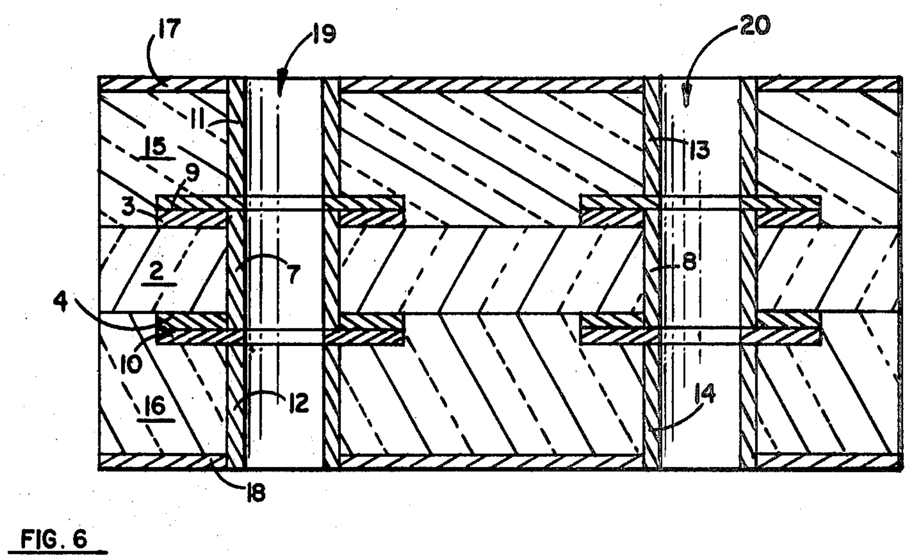
FIG. 6 is a cross-sectional view of the FIG. 1 board after holes have been drilled through the board.

FIG. 6 shows circuit board 1 after dielectric layers 15 and 16 have been placed over the solid interconnections 11 through 14 and copper layers 17 and 18 have been deposited on the outer surfaces of dielectric layers 15 and 16. In addition, holes 19 and 20 have been drilled through circuit layers 17, 9, 3, 4, 10 and 18 and through solid interconnections 11, 7, 12, 13, 8 and 14. It is pointed out that one electrical conduction path is provided between all of the circuit layers through the solid interconnections. FIG. 6 illustrates circuit board 1 as a multilayer circuit board comprising three layers.

Figure 7:
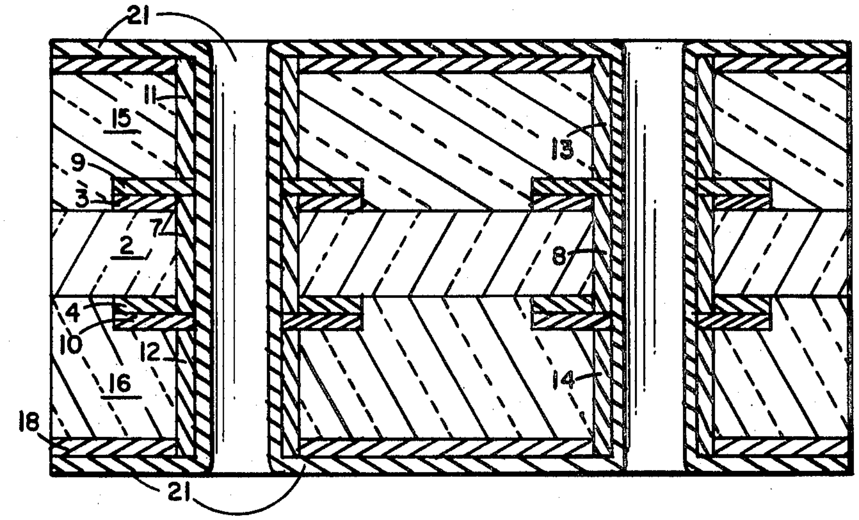
FIG. 7 is a cross-sectional view of the FIG. 2 board after the holes have been plated.

FIG. 7 shows the circuit board 1 after the outer dielectric layers 17 and 18 and the holes 19 and 20 have been plated, for example by a layer of solder, gold, nickel, etc. The plated layer 21 interconnects the circuit layers of the multilayer circuit board so that a second (redundant) electrical conduction path is provided between all of the circuit layers. As indicated above, the first electrical conduction path was provided by the solid interconnections between the layers. Plating processes which can be used to plate the holes and the surface layers are well known to persons skilled in the art and are not described in detail herein.

Figure 8:
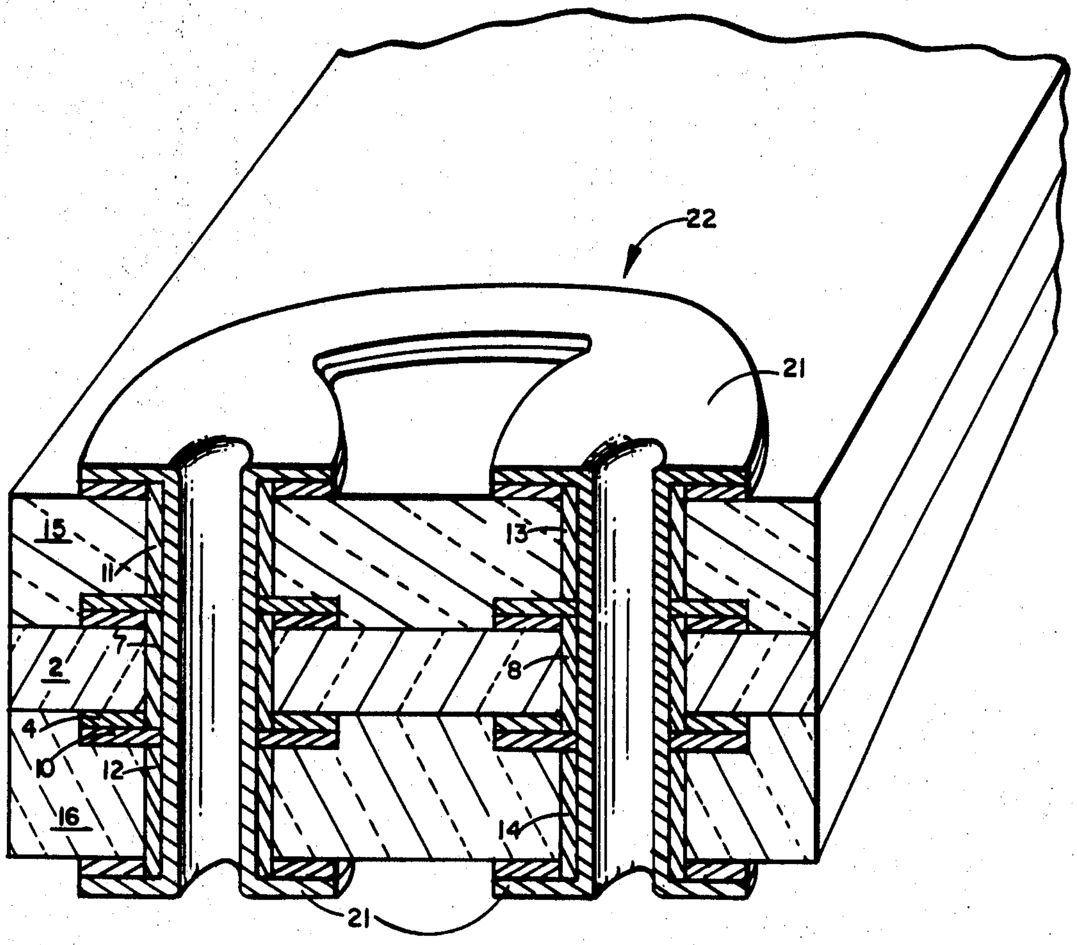
FIG. 8 is a cross-sectional view of the FIG. 3 board after the circuit patterns have been etched in the outer layers.

FIG. 8 shows the multilayer circuit board 1 after layer 21 (on both surfaces of the board) and layers 17 and 18 have been etched into circuit pattern 22 and 23. Only a portion of the circuit patterns for circuit board 1 is shown. It should be understood that the circuit patterns on each of the layers may be more complex than the simple illustration shown and that a variety of conducting materials may be used in producing the circuit patterns. For purposes of this description, it was assumed that the conducting layers, excluding layer 21, were comprised of copper. Layer 21 is ordinarily comprised of a gold material.

Processes for etching the conducting layers are also well known in the art. The particular etchant, temperature, and other requirements depend on the particular conducting material involved. For example, $FeCl_3$ may be used to etch copper.

The redundant electrical connections described in connection with FIG. 7 can be more clearly seen in FIG. 8. Circuit patterns 22 and 23 are first connected to the circuit layers of the multilayer board through solid interconnections 7, 8, 11, 12, 13 and 14. The second electrical interconnection between the same circuit layers is provided by the portion of plated layer 21 which is deposited inside the holes 19 and 20 on the inner surfaces of the drilled solid interconnections. Therefore, an epoxy resin or some other material prevents an interconnection from providing electrical continuity, the other interconnection should overcome the deficiency. As a result, a more reliable circuit board is produced.

It is pointed out that other techniques may be used to achieve the second (redundant) interconnection between the layers of the circuit board. For example, instead of plating as described in connection with FIG. 7, a solder coated wire could be inserted and heated until the solder fused to the drilled surface of the solid interconnection.

While the invention has been described with respect to several physical embodiments constructed in accordance therewith, it will be apparent to those skilled in the art that various modifications and improvements may be made without departing from the scope and spirit of the invention. Accordingly, it is to be understood that the invention is not to be limited by specific illustrative embodiments, but only by the scope of the appended claims.

We claim:

1. A process for making a printed circuit structure of a laminate of insulative material and electrically conductive material interconnecting portions of the printed circuit structure which is attached to the insulating material, wherein sheets of the electrically conductive material are bonded to oppositely disposed surfaces of a slice of the insulative material, and wherein solid electrically conductive material is utilized in interconnecting the conductive paths in and on the laminate, comprising the steps of:

forming a first set of apertures transverse the thickness of and through the sheets of conductive and the slice of insulative material;

filling the first set of apertures with a first of the solid electrically conductive material;

depositing a first layer of electrically conductive material on the surfaces of each of said sheets and over the first set of filled apertures;

etching portions of the sheets and first layer thereby forming conductive paths of the remaining portions of the sheets and first layer interconnected by the first of the solid electrically conductive material;

forming a second of the solid electrically conductive material in the form of posts on at least one of the exposed surfaces of the remaining portions of the first layer so that said posts align with the filled first set of apertures;

attaching at least one additional sheet of insulative material to at least one surface of the slice of insulating material and to at least one surface of each of the remaining portions of said sheets and first layer, wherein said at least one additional sheet has been provided with a second set of apertures for alignment with the first set of apertures, each of the second set of apertures being circumjacent respectively to one of the posts, said at least one additional sheet of insulative material being provided with at least one second layer of the electrically conductive material on a surface of said at least one additional sheet of insulating material;

forming openings which extend transversely through the laminate, said openings comprising openings through each of the posts, openings through the remaining portions of the first layer on the surfaces of each of the sheets of conductive material, and openings through each of the first solid electrically conductive material; and forming a metallic film in the openings thus formed and over said at least one second layer of the electrically conductive material for providing a multiplicity of electrically conductive parallel paths between each and every connection of the printed circuit and thereby also strengthening the printed circuit structure.

2. The invention as stated in claim 1, including the further step of etching portions of the plated metallic film external to the openings and portions of said at least one second layer of the electrically conductive material for providing additional conductive paths on the surface of said at least one additional sheet of insulative material, after the step of plating.

3. The invention as stated in claim 1, wherein said at least one second layer of the electrically conductive material being provided is deposited on a surface of said at least one additional sheet of insulating material after said at least one additional sheet of insulative material had been attached to said at least one surface of the slice of insulating material.